(12) United States Patent
Chou et al.

(10) Patent No.: US 11,502,433 B2
(45) Date of Patent: Nov. 15, 2022

(54) CIRCUIT CARD WITH ONBOARD NON-VOLATILE MEMORY FOR PROVIDING CABLE ASSEMBLY DATA TO NETWORK INTERFACE CONTROLLER CHIPS

(71) Applicant: SUPER MICRO COMPUTER, INC., San Jose, CA (US)

(72) Inventors: Mau-Lin Chou, Milpitas, CA (US); John Chen, San Francisco, CA (US); Manhtien V. Phan, Morgan Hill, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 53 days.

(21) Appl. No.: 17/172,993

(22) Filed: Feb. 10, 2021

(65) Prior Publication Data

US 2022/0255248 A1  Aug. 11, 2022

(51) Int. Cl.
*G06F 13/10* (2006.01)
*H01R 12/53* (2011.01)
*H01R 13/66* (2006.01)
*H01R 12/58* (2011.01)
*H04L 12/00* (2006.01)

(52) U.S. Cl.
CPC ............ *H01R 12/53* (2013.01); *H01R 12/58* (2013.01); *H01R 13/6658* (2013.01); *H04L 12/00* (2013.01)

(58) Field of Classification Search
CPC .... G06F 21/82; G06F 9/45504; G06F 13/107; G06F 21/56; G06F 13/4282; G06F 2213/0008; G06F 2213/0036; G06F 2213/0042; G06F 2213/0032; G06F 2213/0028; G06F 2213/0024; G06F 13/36; G06F 3/0679; G06F 3/0635; G06F 3/0613; G06F 3/061; G06F 3/067; G06F 3/0658; G06F 2213/0026; H04L 63/08; H04L 63/0272; Y04S 40/20
See application file for complete search history.

(56) References Cited

U.S. PATENT DOCUMENTS

2020/0057735 A1\* 2/2020 Ganor ................ G06F 13/4282
2020/0242059 A1\* 7/2020 Ganor .................... G06F 13/36
(Continued)

OTHER PUBLICATIONS

Small-form-factor pluggable transceiver—Wikipedia, 14 pages [retrieved on Feb. 1, 2021], retrieved from the internet: https://en.wikipedia.org/wiki/Small_form-factor_pluggable_transceiver.
(Continued)

*Primary Examiner* — Jung Liu
(74) *Attorney, Agent, or Firm* — Beyer Law Group LLP

(57) ABSTRACT

A cable assembly has a cable with a transceiver module on one end. The transceiver module is plugged into an interface connector of a circuit card, which also has a network interface controller chip, an onboard non-volatile memory, and a control unit. The control unit reads cable assembly data stored in a non-volatile memory of the transceiver module over a serial bus and copies the cable assembly data to the onboard non-volatile memory. The control unit initiates transfer of the cable assembly data from the onboard non-volatile memory to a communication port of the network interface controller chip over another serial bus.

18 Claims, 7 Drawing Sheets

(56) References Cited

U.S. PATENT DOCUMENTS

| | | | | |
|---|---|---|---|---|
| 2020/0320023 | A1* | 10/2020 | Litichever | G06F 21/82 |
| 2020/0412558 | A1* | 12/2020 | Ballard | G06F 1/206 |
| 2021/0124590 | A1* | 4/2021 | Itkin | G06F 9/4408 |
| 2021/0182441 | A1* | 6/2021 | Haramaty | G06F 13/4068 |
| 2022/0159013 | A1* | 5/2022 | Zimmerman | H04L 12/4633 |
| 2022/0166727 | A1* | 5/2022 | Waldman | H04L 63/18 |

OTHER PUBLICATIONS

SFPs 101: Six Fundamentals of SFP Transceivers | Star-Tec.Blog, 8 pages [retrieved on Feb. 1, 2021], retrieved from the internet: https://blog.startech.com/post/sfps-101-six-fundamentals-of-sfp-transceivers/.

ConnectX-6 Lx Ethernet SmartNIC, 25GbE Performace at theSpeed of Lite, 2020, Mellanox Technologies, 2 pages.

World-Class Performance Ethernet SamartNICs Product Line—Ethernet Network Adapters with Advanced Hardware Accelerators, Unequaled RoCE Capabilities and Enhanced Security, Enabling Data Center Efficiency and Scalability, 2020, Mellanox Technologies, 8 pages.

NVIDIA Mellanox Connectx-6 DX Product Brief—Ethernet Smartnic, Aug. 2020, 4 pages.

\* cited by examiner

CIRCUIT CARD WITH ONBOARD NON-VOLATILE MEMORY FOR PROVIDING CABLE ASSEMBLY DATA TO NETWORK INTERFACE CONTROLLER CHIPS

BACKGROUND OF THE INVENTION

1. Field of the Invention

The present invention relates generally to data communications over a computer network.

2. Description of the Background Art

A network interface card (NIC) is a type of add-on card (AOC) that allows a computer to communicate over a computer network. The NIC may be connected to the computer network using a cable assembly. Cable assemblies have been developed to facilitate high-speed data communication over computer networks. Such cable assemblies may comprise a cable with a so-called Small Form-Factor Pluggable (SFP) transceiver module on each end. An SFP transceiver module includes an electrically erasable programmable read-only memory (EEPROM) that stores cable assembly data, such as information on cable length, cable type, passive or active Serializer/Deserializer (SERDES), vendor identification (ID), and other cable assembly-related information. An SFP transceiver module is pluggable to a corresponding interface connector on a NIC, Ethernet Switch, or other networking device. The cable itself is typically a fiber optic cable but may also be a copper cable.

Various types of SFP transceiver modules are available to support different data rates, i.e., data transmission speeds. For example, an SFP28 transceiver module supports a data rate of 25 Gbit/s, whereas a Quad Small Form-factor Pluggable 28 (QSFP28) transceiver module supports a data rate of 100 Gbit/s. A cable assembly may have a QSFP28 transceiver module on both ends to support a data rate of 100 Gbit/s on a single cable. A cable assembly may also have four cables, with the ends of the four cables terminating on a QSFP28 transceiver module and opposing ends of the four cables each terminating on a SFP28 transceiver module (thus supporting 4×25 Gbit/s operation).

Network interface controller chips (i.e., integrated circuits) have been developed to support cable assemblies that have SFP transceiver modules. For example, the CX-6LX™ chip from Mellanox Technologies, Inc. provides two communication ports, with each communication port capable of supporting an SFP28 data rate, i.e., 25 Gbit/s. As another example, the CX-6DX™ chip, also from Mellanox Technologies, Inc., provides two communication ports, with each communication port capable of supporting a QSFP28 data rate, i.e., 100 Gbit/s. For proper operation, each communication port requires access to cable assembly data stored in the EEPROM of a corresponding SFP28 or QSFP28 transceiver module.

SUMMARY

In one embodiment, a cable assembly has a cable with a transceiver module at least on one end. The transceiver module is plugged into an interface connector of a circuit card, which comprises a network interface controller chip, an onboard non-volatile memory, and a control unit. The control unit reads cable assembly data stored in a non-volatile memory of the transceiver module over a serial bus and copies the cable assembly data to the onboard non-volatile memory. The control unit initiates transfer of the cable assembly data from the onboard non-volatile memory to a first communication port of the network interface controller chip over another serial bus. In some embodiments, the control unit further initiates transfer of the cable assembly data from the non-volatile memory of the transceiver module to a second communication port of the network interface controller chip.

These and other features of the present invention will be readily apparent to persons of ordinary skill in the art upon reading the entirety of this disclosure, which includes the accompanying drawings and claims.

The use of the same reference label in different drawings indicates the same or like components. The figures are not drawn to scale.

DETAILED DESCRIPTION

In the present disclosure, numerous specific details are provided, such as examples of systems, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
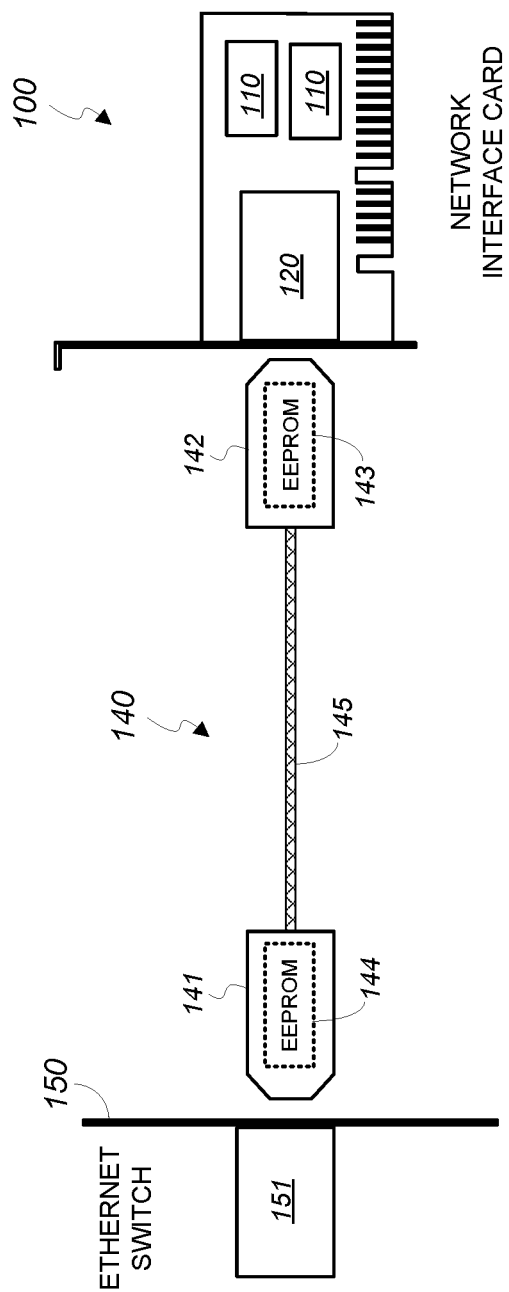
FIG. 1 is a logical diagram of a computer network in accordance with an embodiment of the present invention.

FIG. 1 is a logical diagram of a computer network in accordance with an embodiment of the present invention. In the example of FIG. 1, an add-on card in the form of a network interface card (NIC) 100 sends and transmits data by way of a networking switch, which in the example of FIG. 1 is an Ethernet switch 150. The NIC 100 is an add-on card in that it is removably connected to a computer (not shown), such as a server computer, desktop computer, or other computing device. In one embodiment, the NIC 100 is pluggable to a Peripheral Component Interconnect Express (PCIe) bus of a computer.

In the example of FIG. 1, a cable assembly 140 connects the NIC 100 to the Ethernet switch 150. The Ethernet switch 150 may be a conventional networking switch, such as those available from the assignee of the present application, which is Super Micro Computer, Inc. of San Jose, Calif.

In one embodiment, the cable assembly 140 is a commercially-available cable assembly. The cable assembly 140 comprises a cable 145, a transceiver module 141, and a transceiver module 142. In the example of FIG. 1, each of the transceiver modules 141 and 142 is a QSFP28 transceiver module, and the cable 145 is a fiber optic cable. The transceiver module 141 has a non-volatile memory in the form of an EEPROM 144 and the transceiver module 142 has a non-volatile memory in the form of an EEPROM 143. As is conventional, each of the EEPROM 144 and EEPROM 143 stores cable assembly data, such as information on cable length, cable type, passive or active SERDES, vendor ID, and other cable assembly-related information. During operation, the transceiver module 141 is plugged to an interface connector 151 of the Ethernet switch 150 and the transceiver module 142 is plugged to an interface connector 120 of the NIC 100. In the example of FIG. 1, the connector 151 is a QSFP28 interface and the connector 120 is also a QSFP28 interface.

Add-on cards have to meet dimension requirements in order to physically fit into a chassis of a computer. In one embodiment, the NIC 100 has a so-called half-height, half-length PCIe form factor. The relatively small form-factor of the NIC 100 only has enough room to accept a single SFP transceiver module. As can be appreciated, although embodiments of the present invention are explained in the context of an add-on card, embodiments of the present invention are equally suitable to other applications that have physical space restrictions, such as in Local Area Network (LAN) on motherboard (LOM) applications.

In the example of FIG. 1, the NIC 100 has two network interface controller chips 110. Each of the network interface controller chips 110 has two communication ports that each supports an SFP28 transceiver module. Accordingly, a network interface controller chip 110 can support a data rate of 50 Gbit/s (2×25 Gbit/s) and two network interface controller chips 110 can support a combined data rate of 100 Gbit/s, which matches with the 100 Gbit/s data rate capability of the transceiver module 142 (which is a QSFP28 transceiver module). However, a possible issue arises because four communication ports require four separate EEPROMs containing cable assembly data, but there is only one EEPROM 143.

Figure 2:
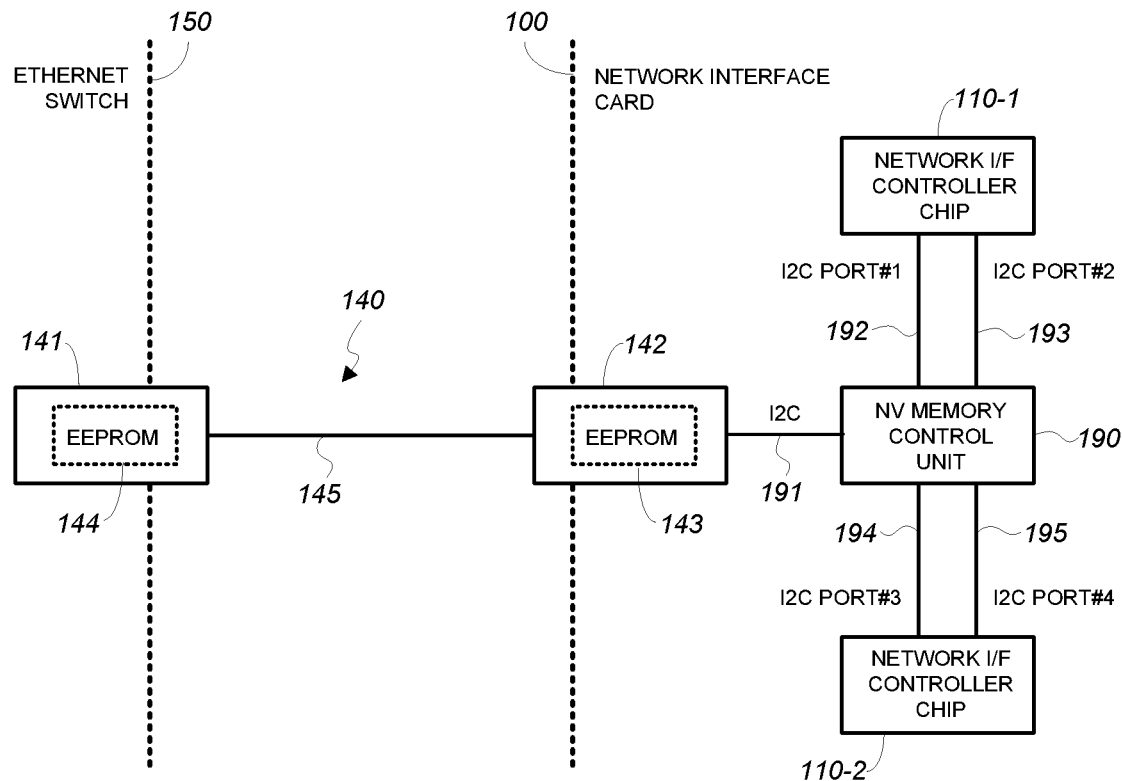
FIG. 2 is a logical diagram of a network interface card (NIC) in the computer network of FIG. 1 in accordance with an embodiment of the present invention.

FIG. 2 is a logical diagram of the NIC 100 in the computer network of FIG. 1 in accordance with an embodiment of the present invention. The NIC 100 includes two network interface controller chips 110 (i.e., 110-1 and 110-2) and a non-volatile memory control unit 190. Components of the NIC 100, such as the non-volatile memory control unit 190, the network interface controller chips 110, non-volatile memory on the NIC 100 (see FIG. 5, EEPROMs 302-1, 302-2, and 302-3; FIG. 6, EEPROMs 351-1, 351-2, and 351-3), and other components on the NIC 100 are referred to herein as "onboard" components. As can be appreciated, the transceiver module 142, being part of the cable assembly 140 is not an onboard component of the NIC 100. As previously explained, the cable assembly 140 comprises the cable 145, which is terminated by the transceiver module 141 on one end and terminated by the transceiver module 142 on the other end. The transceiver module 142 is removably connected to an interface connector (FIG. 1, 120) on the NIC 100 and the transceiver module 141 is removably connected to an interface connector (FIG. 1, 151) on the Ethernet switch 150.

The non-volatile memory control unit 190, which is also referred to herein simply as "the control unit 190", may be implemented using a microcontroller chip, complex programmable logic device (CPLD), application-specific integrated circuit (ASIC), field programmable gate array (FPGA), discrete circuit, or other circuit. In one embodiment, the control unit 190 is implemented using a commercially-available microcontroller chip. The control unit 190 is configured to communicate with the transceiver module 142 over a serial bus 191, which in one embodiment is the Inter-Integrated Circuit (I2C) bus. The control unit 190 receives an image of the EEPROM 143 by reading the contents of the EEPROM 143 over the serial bus 191. The control unit 190 stores the image of the EEPROM 143, which includes cable assembly data as previously described, in a plurality of onboard non-volatile memory (see FIG. 5, EEPROMs 302-1, 302-2, and 302-3; FIG. 6, EEPROMs 351-1, 351-2, and 351-3) and initiates transfer of the image from the plurality of onboard non-volatile memory to corresponding communication ports of the network interface controller chips 110.

The control unit 190 may be configured to provide the image of the EEPROM 143 from the plurality of onboard non-volatile memory to corresponding communication ports over separate serial buses, which in one embodiment are separate I2C buses. In one embodiment, the control unit 190 is configured to provide the image from a first onboard non-volatile memory to a communication port of the network interface controller chip 110-1 over a serial bus 193 ("I2C PORT #2"), to provide the image from a second onboard non-volatile memory to a communication port of the network interface controller chip 110-2 over a serial bus 194 ("I2C PORT #3"), and to provide the image from a third onboard non-volatile memory to another communication port of the network interface controller chip 110-2 over a serial bus 195 ("I2C PORT #4").

To save on the number of onboard non-volatile memory, one communication port may read cable assembly data directly from the EEPROM 143. In one embodiment, the lines of the serial bus 191 may be connected to corresponding lines of a serial bus 192 ("I2C PORT #1"), thereby allowing a communication port of the network control interface chip 110-1 to read cable assembly data directly from the EEPROM 143 over the serial bus 192/191.

Figure 3:
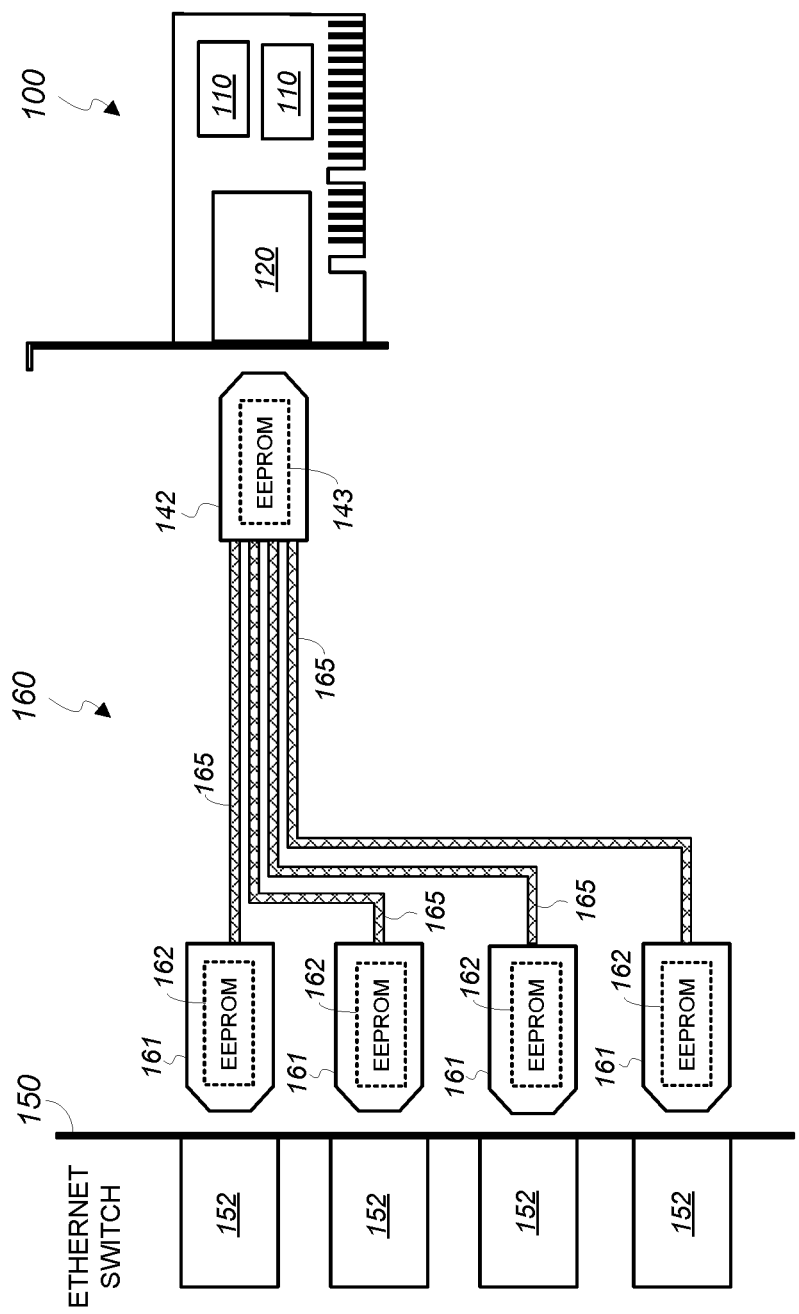
FIG. 3 is a logical diagram of a computer network in accordance with another embodiment of the present invention.

Embodiments of the present invention are also suitable for applications involving other types of cable assemblies. FIG. 3 is a logical diagram of a computer network in accordance with another embodiment of the present invention. The computer network of FIGS. 1 and 3 are the same, except for the use of a cable assembly 160 in FIG. 3. The Ethernet switch 150 and the NIC 100 are otherwise as previously described.

The cable assembly 160 connects the NIC 100 to the Ethernet switch 150. In one embodiment, the cable assembly 160 is a commercially-available cable assembly. The cable assembly 160 comprises a plurality of cables 165, a plurality of transceiver modules 161, and the transceiver module 142. In one embodiment, each of the transceiver modules 161 is an SFP28 transceiver module, the transceiver module 142 is a QSFP28 transceiver module, and each of the cables 165 is a fiber optic cable. One end of each of the cables 165 is terminated by the transceiver module 142, and the other end of each of the cables 165 is terminated by a corresponding transceiver module 161. Each of the transceiver modules 161 has a non-volatile memory in the form of an EEPROM 162 and the transceiver module 142 has a non-volatile memory in the form of the EEPROM 143. As is conventional, an EEPROM 162 and an EEPROM 143 store cable assembly data. During operation, the transceiver modules 161 are plugged to corresponding interface connectors 152 of the Ethernet switch 150 and the transceiver module 142 is plugged to the interface connector 120 of the NIC 100. In the example of FIG. 3, each of the interface connectors 152 is an SFP28 interface and the interface connector 120 is a QSFP28 interface.

Figure 4:
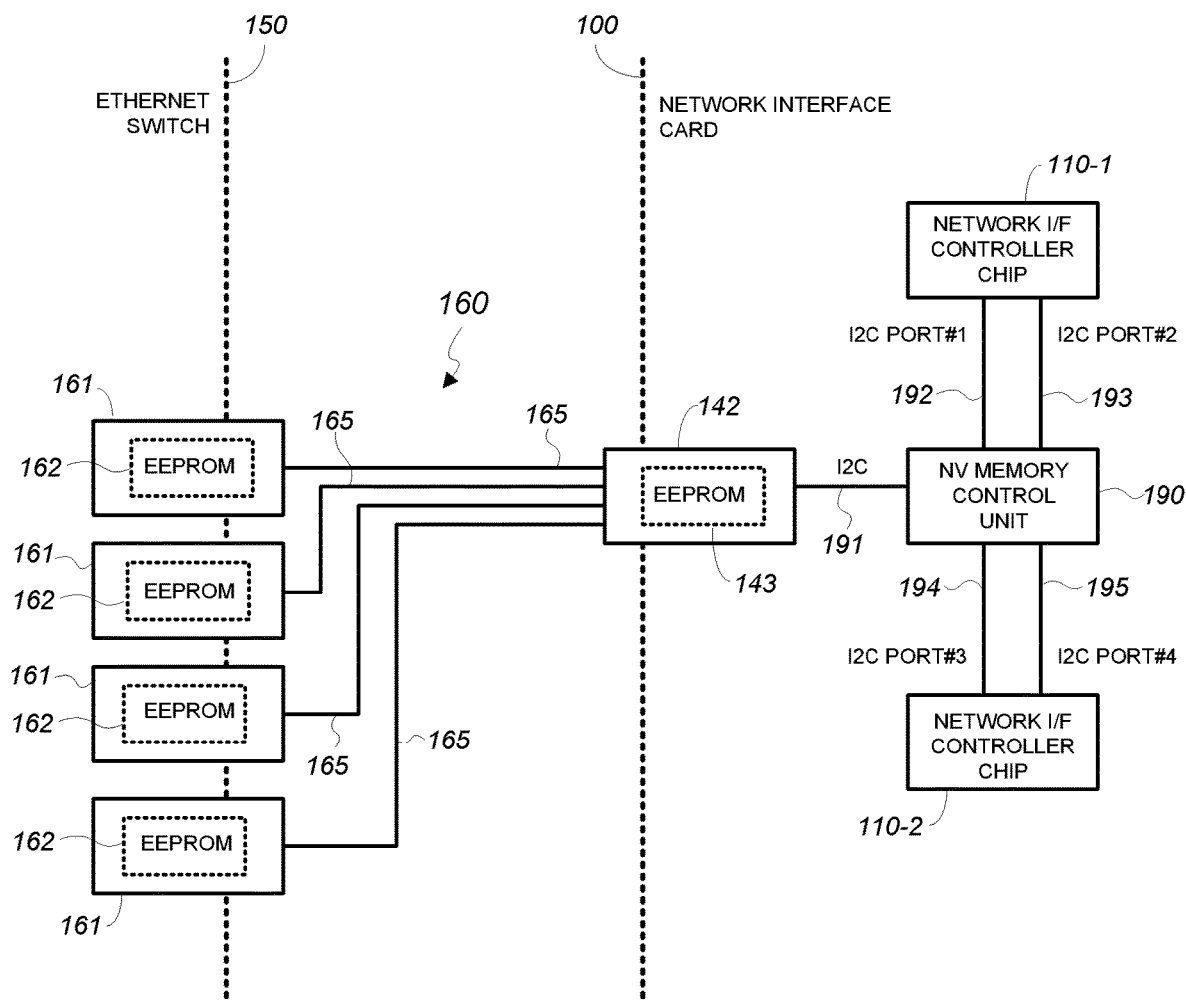
FIG. 4 is a logical diagram of the NIC in the computer network of FIG. 3 in accordance with an embodiment of the present invention.

FIG. 4 is a logical diagram of the NIC 100 in the computer network of FIG. 3 in accordance with an embodiment of the present invention. FIGS. 2 and 4 are the same except for the use of the cable assembly 160 in FIG. 4. In the example of FIG. 4, the transceiver module 142 is removably connected to an interface connector (FIG. 3, 120) on the NIC 100 and the transceiver modules 161 are removably connected to corresponding interface connectors (FIG. 3, 152) on the Ethernet switch 150. In both FIGS. 2 and 4, the control unit 190 operates in the same way with respect to replicating the image of the EEPROM 143 in a plurality of onboard non-volatile memory and initiating transfer of the image from the plurality of onboard non-volatile memory to corresponding communication ports of the network interface controller chips 110.

Figure 5:
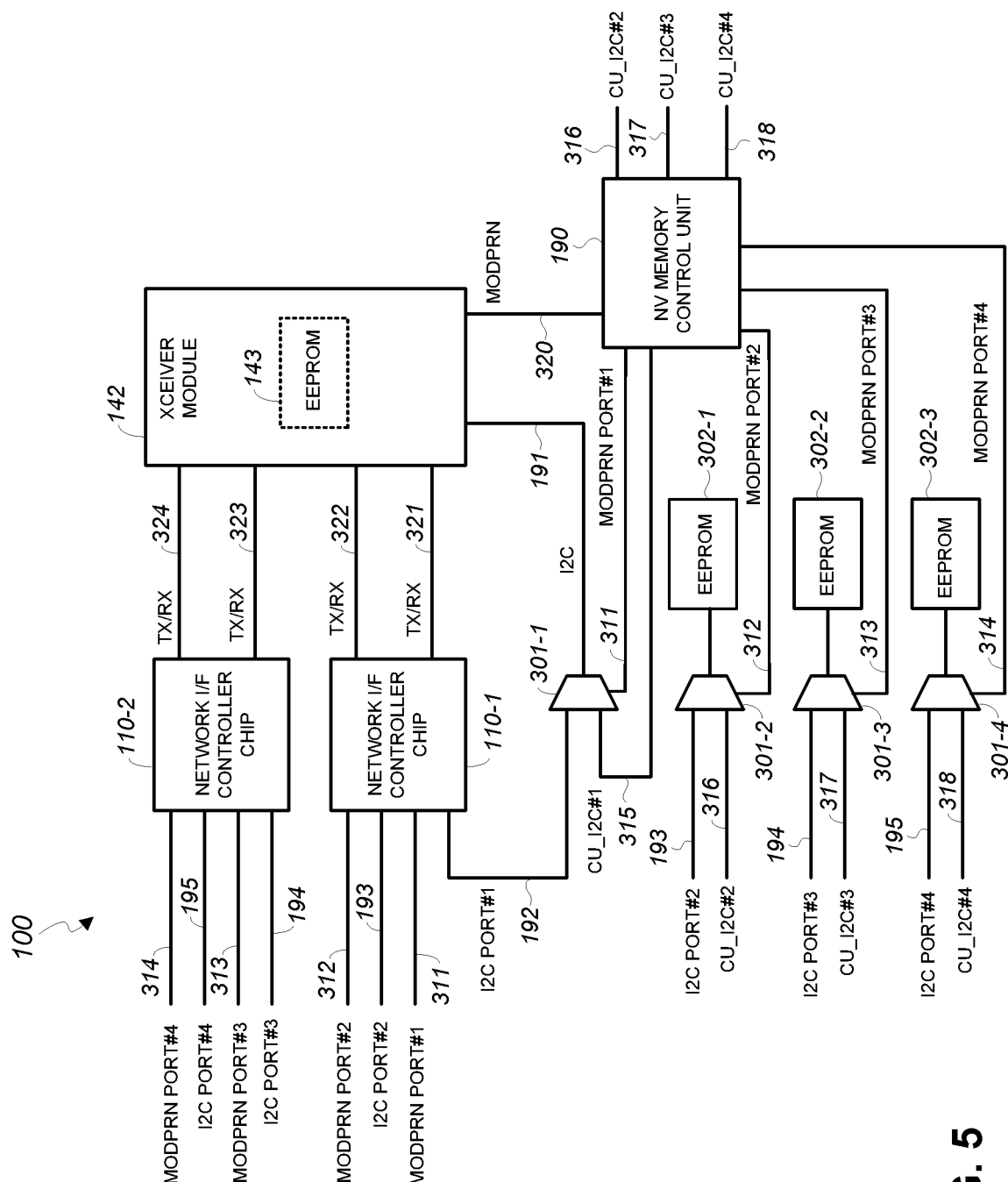
FIG. 5 is a logical diagram of an NIC in accordance with an embodiment of the present invention.
Figure 6:
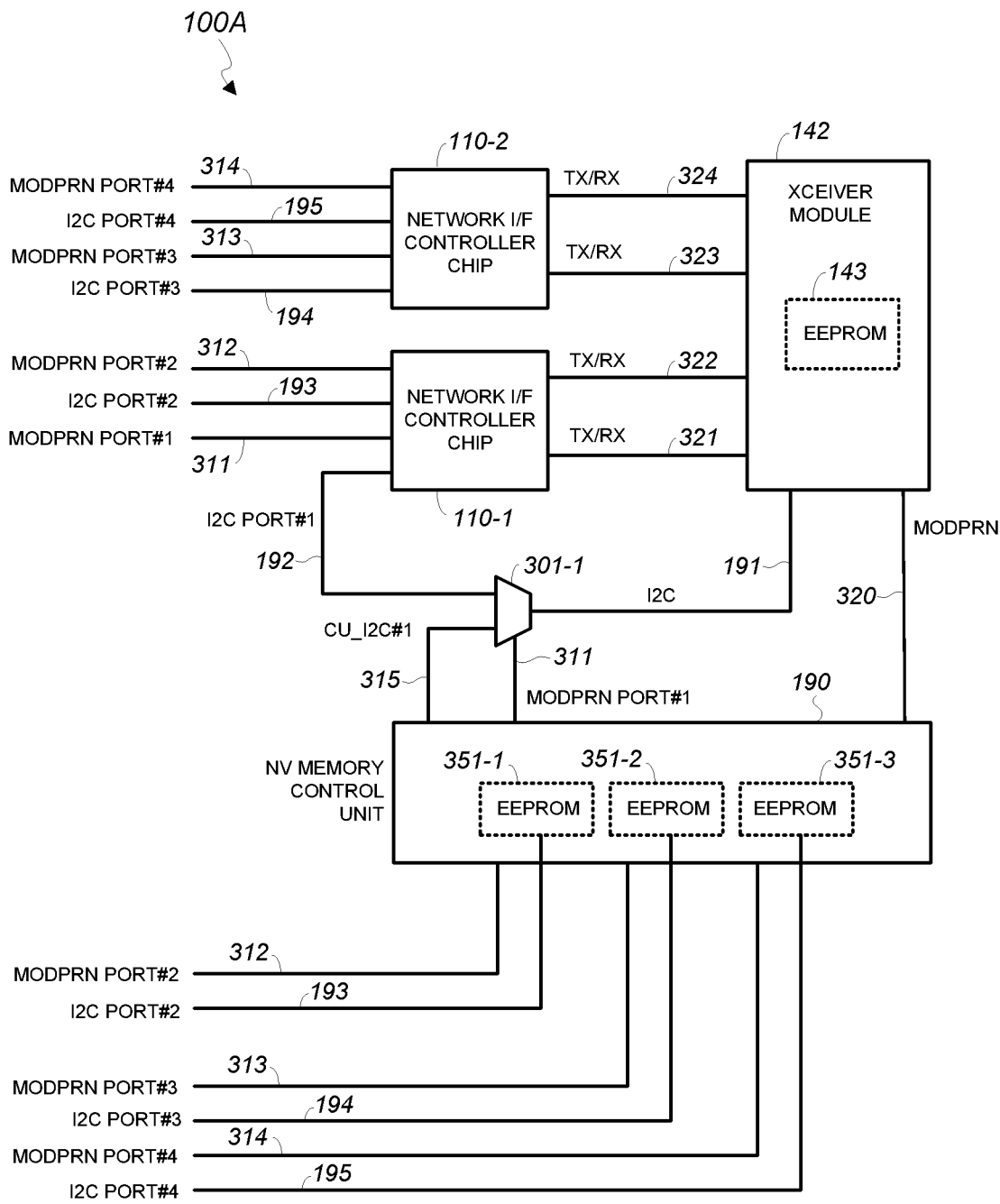
FIG. 6 is a logical diagram of an NIC in accordance with another embodiment of the present invention.

FIG. 5 is a logical diagram of the NIC 100 in accordance with an embodiment of the present invention. The NIC 100 includes the network interface controller chips 110, the control unit 190, a plurality of non-volatile memory in the form of EEPROMs 302 (i.e., 302-1, 302-2, and 302-3), and a plurality of switches (e.g., multiplexers) 301 (i.e., 301-1, 301-2, 301-3, and 301-4).

Also shown in FIG. 5 is the transceiver module 142, which is removably connected to an interface connector of the NIC 100 (FIGS. 1 and 3, 120). In this embodiment where the transceiver module 142 is a QSFP28 transceiver module, the transceiver module 142 accommodates four data communication lanes (FIG. 5, 321-324), with each lane supporting data rates of an SFP28 transceiver module. Each of the data communication lanes is connected to a corresponding communication port of a network interface controller chip 110. A data communication lane comprises signal lines (TX/RX) for transmitting and receiving data.

Each communication port of a network interface controller chip 110 has an associated data communication lane, serial bus, and module presence signal. In the example of FIG. 5, the data communication lane 321 is connected to a first communication port of the network interface controller chip 110-1, the data communication lane 322 is connected to a second communication port of the network interface controller chip 110-1, the data communication lane 323 is connected to a first communication port of the network interface controller chip 110-2, and the data communication lane 324 is connected to a second communication port of the network interface controller chip 110-2.

Each communication port is connected to receive a module presence signal that indicates whether or not a transceiver module is present. Each communication port is also connected to an associated serial bus for transferring cable assembly data from the EEPROM of the transceiver module. Accordingly, in a conventional application, four communication ports require four EEPROMs to provide cable assembly data. In the example of FIG. 5, however, there is only one transceiver module, and thus a single EEPROM for providing cable assembly data to four communication ports.

In the example of FIG. 5, the control unit 190 is connected to receive an external module presence ("MODPRN") signal 320. The module presence signal 320 is asserted (i.e., active) when the transceiver module 142 is connected to the NIC 100, and de-asserted (i.e., inactive) when the transceiver module 142 is not connected to the NIC100. The control unit 190 is configured to generate internal module presence signals 311-314, one for each communication port. The internal module presence signals 311-314 are also labeled as MODPRN PORT #1, MODPRN PORT #2, MODPRN PORT #3, and MODPRN PORT #4, respectively.

The control unit 190 de-asserts all of the internal module presence signals 311-314 while the module presence signal 320 is de-asserted, i.e., when the transceiver module 142 is not connected to the NIC 100. When the module presence signal 320 is asserted, indicating that the transceiver module 142 has been plugged into the NIC 100, the internal module presence signal 311 remains de-asserted to control the switch 301-1 to connect the lines of the serial bus 191 to corresponding lines of a serial bus 315 ("CU_I2C #1") to the control unit 190. This allows the control unit 190 to read and copy the image of the EEPROM 143 over the serial bus 315/191.

A switch 301 connects a serial bus between the control unit 190 and an EEPROM 302 when a corresponding internal module presence signal is de-asserted, thereby allowing the control unit 190 to save the image of the EEPROM 143 to the EEPROM 302 over the serial bus. Each EEPROM 302 may have a corresponding serial bus interface, which is not shown for ease of illustration. The image of the EEPROM 143 may be copied to each EEPROM 302 one at a time or to all of the EEPROMs 302 at the same time. In either case, the control unit 190 asserts an internal module presence signal after the image of the EEPROM 143 has been copied to a corresponding EEPROM 302. Asserting an internal module presence signal indicates to the corresponding communication port that the transceiver module 142 has been plugged in.

For example, the switch 301-2 connects a serial bus 316 ("CU_I2C #2") between the control unit 190 and the EEPROM 302-1 when the internal module presence signal 312 is de-asserted, thereby allowing the control unit 190 to transfer the image of the EEPROM 143 to the EEPROM 302-1 over the serial bus 316; the switch 301-3 connects a serial bus 317 ("CU_I2C #3") between the control unit 190 and the EEPROM 302-2 when the internal module presence signal 313 is de-asserted, thereby allowing the control unit 190 to transfer the image of the EEPROM 143 to the EEPROM 302-2 over the serial bus 317; and the switch 301-4 connects a serial bus 318 ("CU_I2C #4") between the control unit 190 and the EEPROM 302-3 when the internal module presence signal 313-4 is de-asserted, thereby allowing the control unit 190 to transfer the image of the EEPROM 143 to the EEPROM 302-3 over the serial bus 318.

The control unit 190 asserts an internal module presence signal for a communication port to allow the corresponding network interface controller chip 110 to read the cable assembly data. In the example of FIG. 5, the control unit 190 asserts the internal module presence signal 311 to control the switch 301-1 to connect the lines of the serial bus 191 to corresponding lines of the serial bus 192 (FIG. 5, I2C PORT #1). The network interface controller chip 110-1 detects the asserted internal module presence signal 311 and accordingly proceeds to read cable assembly data for its first communication port from the EEPROM 143 over the serial bus 192/191. In this example, the first communication port of the network interface controller chip 110-1 receives cable assembly data directly from the transceiver module 142. This advantageously decreases the number of onboard EEPROMs 302.

The control unit 190 asserts the internal module presence signal 312 to control the switch 301-2 to connect the EEPROM 302-1 to the serial bus 193 to the second communication port of the network interface controller chip 110-1 (FIG. 5, I2C PORT #2). The network interface controller chip 110-1 detects the asserted internal module presence signal 312 and accordingly proceeds to read cable assembly data for its second communication port from the EEPROM 302-1 over the serial bus 193.

Similarly, the control unit 190 asserts the internal module presence signal 313 to control the switch 301-3 to connect the EEPROM 302-2 to the serial bus 194 to a first communication port of the network interface controller chip 110-2 (FIG. 5, I2C PORT #3). The network interface controller chip 110-2 detects the asserted internal module presence signal 313 and accordingly proceeds to read cable assembly data for its first communication port from the EEPROM 302-2 over the serial bus 194. Also, the control unit 190 asserts the internal module presence signal 314 to control the switch 301-4 to connect the EEPROM 302-3 to the serial bus 195 to the second communication port of the network interface controller chip 110-2 (FIG. 5, I2C PORT #4). The network interface controller chip 110-2 detects the asserted internal module presence signal 314 and accordingly proceeds to read cable assembly data for its second communication port from the EEPROM 302-3 over the serial bus 195.

In the example of FIG. 5, the NIC 100 has a plurality of EEPROMs 302 that are distinct and separate from the control unit 190. As can be appreciated, the EEPROMs 302 may also be integrated into the control unit 190 as now described with reference to FIG. 6.

FIG. 6 is a logical diagram of a NIC 100A in accordance with an embodiment of the present invention. The NIC 100A is a particular embodiment of the NIC 100, where the control unit 190 includes integrated EEPROMs 351 (i.e., 351-1, 351-2, and 351-3). For example, the non-volatile memory control unit 190 may be a microcontroller chip with built-in EEPROMs. In the example of FIG. 6, the serial bus 193 ("I2C PORT #2") connects the EEPROM 351-1 to a second communication port of the network interface controller chip 110-1, the serial bus 194 ("I2C PORT #3") connects the EEPROM 351-2 to a first communication port of the network interface controller chip 110-2, and the serial bus 195 ("I2C PORT #4") connects the EEPROM 351-3 to a second communication port of the network interface controller chip 110-2.

The NIC 100A works similarly to the NIC 100. In the example of FIG. 6, the control unit 190 is connected to receive the external module presence signal 320, which indicates whether or not the transceiver module 142 is connected to the NIC 100A. The control unit 190 de-asserts all of the internal module presence signals 311-314 while the module presence signal 320 is de-asserted. When the module presence signal 320 is asserted, indicating that the transceiver module 142 has been plugged into the NIC 100A, the internal module presence signal 311 remains de-asserted to control the switch 301-1 to connect the lines of the serial bus 191 to corresponding lines of the serial bus 315. This allows the control unit 190 to read and copy the image of the EEPROM 143 over the serial bus 315/191. The control unit 190 copies the image of the EEPROM 143 to each of the EEPROMs 351-1, 351-2, and 351-3.

The control unit 190 asserts the internal module presence signals 311-314 to initiate transfer of cable assembly data to the communication ports. Asserting the internal module presence signal 311 controls the switch 301-1 to connect the lines of the serial bus 191 to corresponding lines of the serial bus 192. The network interface controller chip 110-1 detects the asserted internal module presence signal 311 and accordingly proceeds to read cable assembly data for its first communication port from the EEPROM 143 over the serial bus 192/191.

Asserting the internal module presence signal 312 alerts the network controller chip 110-1 of the presence of the transceiver module 142. Accordingly, the network controller chip 110-1 proceeds to read cable assembly data for its second communication port from the EEPROM 351-1 over the serial bus 193. Similarly, in response to asserted internal module presence signals 313 and 314, the network controller chip 110-2 proceeds to read cable assembly data from the EEPROM 351-2 and EEPROM 351-3, for its corresponding communication ports, over the serial buses 194 and 195, respectively.

After reading and processing cable assembly data, the network controller chips 110 proceed to perform network data communication in conjunction with the transceiver module 142. The above-described embodiments have been explained in the context of transceivers and network interface controller chips for SFP-compliant devices. As can be appreciated, embodiments of the present invention are generally suitable for applications where non-volatile memory data replication is needed.

Figure 7:
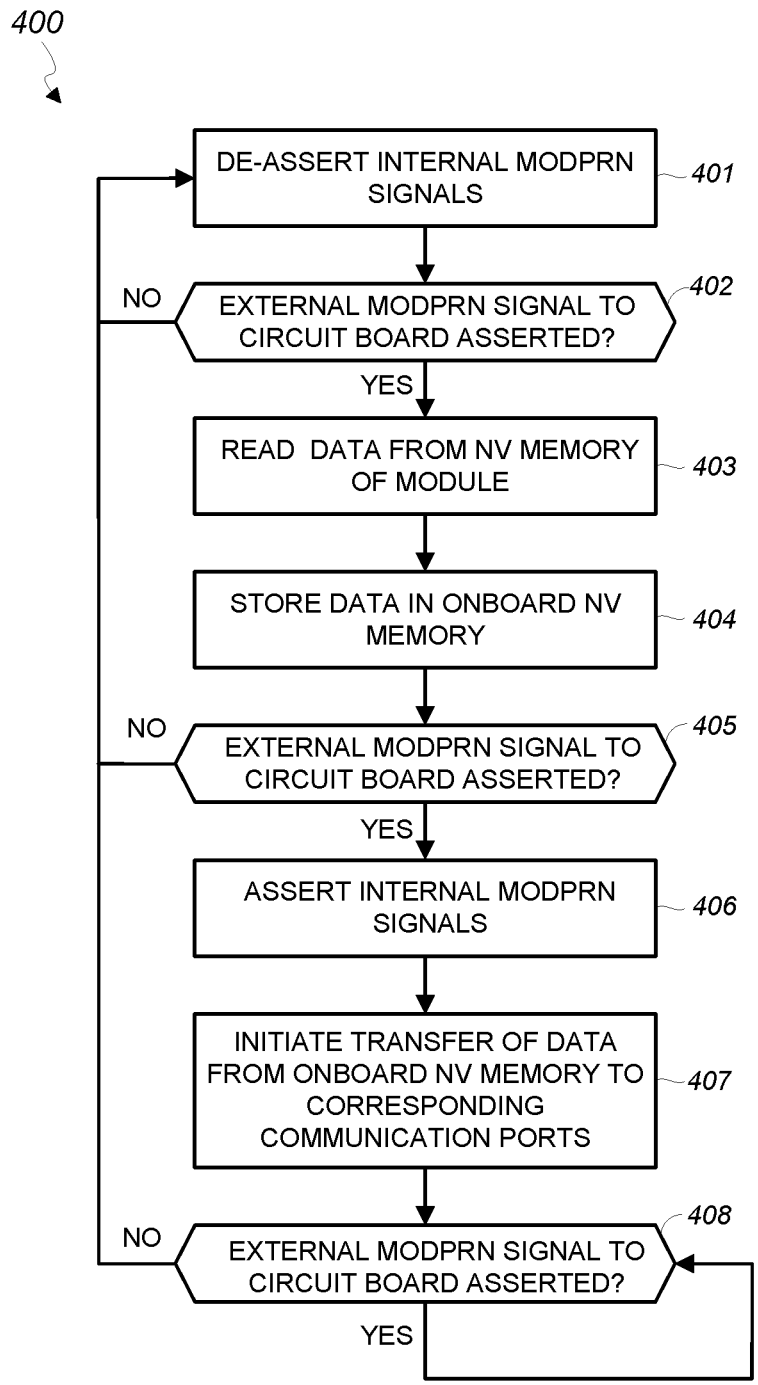
FIG. 7 is a flow diagram of a method of providing cable assembly data to communication ports of a network interface controller chip in accordance with an embodiment of the present invention.

FIG. 7 is a flow diagram of a method 400 of providing cable assembly data to a network interface controller chip of a circuit card in accordance with an embodiment of the present invention. In the method 400, a control unit of the circuit card de-asserts internal module presence signals to corresponding communication ports of the network interface controller chip when a transceiver module of a cable assembly is not plugged into the circuit card (step 401). The control unit of the circuit card monitors for an external module presence signal that indicates whether or not the transceiver module is plugged into the circuit card (step 402). In response to detecting the external module presence signal being asserted, the control unit reads cable assembly data from a non-volatile memory of the transceiver module (step 402 to 403). The control unit stores the cable assembly data in one or more onboard non-volatile memory on the circuit card (step 404). An onboard non-volatile memory may be a separate memory chip or integrated with the control unit.

The control unit checks to ensure that the external module presence signal is still asserted (step 405), i.e., that the transceiver module is still plugged into the circuit card. If the external module presence signal is still asserted (step 405 to step 406), the control unit asserts the internal module presence signals to alert the communication ports that the transceiver module has been plugged into the circuit card (step 406). Asserting an internal module presence signal initiates transfer of cable assembly data from an onboard non-volatile memory to a corresponding communication port of the network interface controller chip (step 407). That is, in response to the internal module presence signals being asserted, the network interface controller chip reads the cable assembly data from corresponding onboard non-volatile memory over respective serial buses of its communication ports. In one embodiment, in response to an internal module presence signal being asserted, the network interface controller chip reads the cable assembly data for a communication port directly from the non-volatile memory of the transceiver module of the cable assembly. After reading cable assembly data for the communication ports, the network controller chip proceeds with data communication in conjunction with the transceiver module of the cable assembly. The above process continues while the transceiver module is plugged into the circuit card (step 408 loop).

It is to be noted that disconnecting the transceiver module from the circuit card will cause the external module presence signal to the transceiver module to be de-asserted (step 402 to step 401; step 405 to step 401; step 408 to step 401), thereby restarting the method 400 from the beginning. This ensures that only cable assembly data from the currently connected transceiver module are provided to the network interface controller chip.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A network interface card (NIC) comprising:
an interface connector that is configured to removably accept a first transceiver module of a cable assembly, the cable assembly comprising a cable, the first transceiver module, and a second transceiver module, wherein the first transceiver module is on one end of the cable and the second transceiver module is on an opposing end of the cable;
a first network interface controller chip on the NIC;
a first onboard non-volatile memory on the NIC;
a second onboard non-volatile memory on the NIC;
a third onboard non-volatile memory on the NIC; and
a control unit on the NIC, the control unit being configured to read cable assembly data stored in a non-volatile memory of the first transceiver module, to copy the cable assembly data to the first onboard non-volatile memory, and to initiate transfer of the cable assembly data from the first onboard non-volatile memory to a first communication port of the first network interface controller chip, wherein the control unit is configured to copy the cable assembly data to the second onboard non-volatile memory and to the third onboard non-volatile memory.

2. The NIC of claim 1, wherein the control unit is configured to initiate transfer of the cable assembly data from the non-volatile memory of the first transceiver module to a second communication port of the first network interface controller chip.

3. The NIC of claim 1, wherein the control unit is configured to detect that the first transceiver module is removably connected to the NIC by monitoring for a first module presence signal.

4. The NIC of claim 3, wherein the control unit is configured to initiate transfer of the cable assembly data from the first onboard non-volatile memory to the first communication port of the first network interface controller chip by asserting a second module presence signal to the first network interface controller chip.

5. The NIC of claim 1, further comprising:
a second network interface controller chip on the NIC, wherein the control unit is configured to initiate transfer of the cable assembly data from the second onboard non-volatile memory to a first communication port of the second network interface controller chip and to initiate transfer of the cable assembly data from the third onboard non-volatile memory to a second communication port of the second network interface controller chip.

6. The NIC of claim 5, wherein the control unit is configured to read the cable assembly data from the non-volatile memory of the first transceiver module over a first serial bus, to initiate transfer of the cable assembly data from the first onboard non-volatile memory to the first communication port of the first network interface controller chip over a second serial bus, to initiate transfer of the cable assembly data from the second onboard non-volatile memory to the first communication port of the second network interface controller chip over a third serial bus, and to initiate transfer of the cable assembly data from the third onboard non-volatile memory to the second communication port of the second network interface controller chip over a fourth serial bus.

7. The NIC of claim 5, wherein the first transceiver module is a Small Form-Factor Pluggable (SFP) transceiver module.

8. The NIC of claim 5, wherein the NIC has a half-height, half-length form factor.

9. The NIC of claim 8, wherein the first transceiver module is a Quad Small Form-factor Pluggable 28 (QSFP28) transceiver module, and each communication port of each of the first and second network interface controller chips supports a Small Form-Factor Pluggable 28 (SFP28) data rate.

10. The NIC of claim 5, wherein the control unit is configured to initiate transfer of the cable assembly data from the non-volatile memory of the first transceiver module to a second communication port of the first network interface controller chip.

11. The NIC of claim 1, wherein the control unit is a microcontroller chip.

12. The NIC of claim 1, wherein each of the non-volatile memory of the first transceiver module and the first onboard non-volatile memory on the NIC is an EEPROM.

13. A method of providing cable assembly data to a network interface controller chip, the method comprising:
detecting connection of a transceiver module of a cable assembly to an interface connector of a circuit card;
reading cable assembly data stored in non-volatile memory of the transceiver module;
copying the cable assembly data to a first onboard non-volatile memory on the circuit card and to a second onboard non-volatile memory on the circuit card;
asserting a first module presence signal to initiate transfer of the cable assembly data from the first onboard non-volatile memory to a first communication port of a first network interface controller chip; and
asserting a second module presence signal to initiate transfer of the cable assembly data from the second onboard non-volatile memory to a second communication port of the first network interface controller chip.

14. The method of claim 13, further comprising:
asserting a third module presence signal to initiate transfer of the cable assembly data from the non-volatile memory of the transceiver module to a first communication port of a second network interface controller chip.

15. The method of claim 14, further comprising:
copying the cable assembly data to a third onboard non-volatile memory on the circuit card; and
asserting a fourth module presence signal to initiate transfer of the cable assembly data from the third onboard non-volatile memory to a second port of the second network interface controller chip.

16. A computer network comprising:
a cable assembly comprising a cable, a first transceiver module, and a second transceiver module, wherein the first transceiver module is on one end of the cable and the second transceiver module is on an opposing end of the cable;
a networking switch comprising an interface connector to which the first transceiver module is removably connected; and a circuit card comprising an interface connector to which the second transceiver module is removably connected, a first network interface controller chip, a first onboard non-volatile memory, and a control unit, wherein the control unit is configured to read cable assembly data stored in a non-volatile memory of the second transceiver module, to copy the cable assembly data to the first onboard non-volatile memory, and to initiate transfer of the cable assembly data from the first onboard non-volatile memory to a first communication port of the first network interface controller chip, wherein the circuit card further comprises a second network interface controller chip, a second onboard non-volatile memory, and a third onboard non-volatile memory, wherein the control unit of the circuit card is configured to copy the cable assembly data to the second onboard non-volatile memory, to copy the cable assembly data to the third onboard non-volatile memory, to initiate transfer of the cable assembly data from the second onboard non-volatile memory to a first communication port of the second network interface controller chip, and to initiate transfer of the cable assembly data from the third onboard non-volatile memory to a second communication port of the second network interface controller chip.

17. The computer network of claim 16, wherein the control unit of the circuit card is configured to initiate transfer of the cable assembly data from the non-volatile memory of the second transceiver module to a second communication port of the first network interface controller chip.

18. The computer network of claim 16, wherein the control unit is configured to read the cable assembly data from the non-volatile memory of the second transceiver module over a first serial bus, to initiate transfer of the cable assembly data from the first onboard non-volatile memory to the first communication port of the first network interface controller chip over a second serial bus, to initiate transfer of the cable assembly data from the second onboard non-volatile memory to the first communication port of the second network interface controller chip over a third serial bus, and to initiate transfer of the cable assembly data from the third onboard non-volatile memory to the second communication port of the second network interface controller chip over a fourth serial bus.

* * * * *